United States Patent [19]
Barron

[11] Patent Number: 4,881,106
[45] Date of Patent: Nov. 14, 1989

[54] DV/DT OF POWER MOSFETS

[75] Inventor: Mark B. Barron, Danville, Calif.

[73] Assignee: IXYS Corporation, San Jose, Calif.

[21] Appl. No.: 197,540

[22] Filed: May 23, 1988

[51] Int. Cl.[4] .................. H01L 29/78; H01L 29/44
[52] U.S. Cl. .................................. 357/23.8; 357/53; 357/68; 357/23.13
[58] Field of Search ................ 357/65, 68, 59, 23.1, 357/53, 23.13, 23.8

[56]                References Cited
            U.S. PATENT DOCUMENTS

| | | | |
|---|---|---|---|
| 3,811,076 | 5/1974 | Smith, Jr. ............................ | 357/53 |
| 4,412,242 | 10/1983 | Herman et al. ...................... | 357/53 |
| 4,636,832 | 1/1987 | Abe et al. ........................... | 357/68 |
| 4,682,195 | 7/1987 | Yilmaz ............................... | 357/68 |

*Primary Examiner*—Andrew J. James
*Assistant Examiner*—Jerome Jackson, Jr.
*Attorney, Agent, or Firm*—Townsend and Townsend

[57]                ABSTRACT

A power MOSFET, such as an n-channel MOSFET, is structured to increase the permissible maximum rate of change in voltage during reverse recovery by reducing or eliminating the well containing the active region under the gate bond pad, or any pad which must be isolated from the source metallization, and by providing a polysilicon sheet between the pad area and the substrate. In an n-channel MOSFET where the gate pad is to be protected, the well is a p-well and the active region is the p-region within the well. The p-region under the gate bond pad is reduced to a strip or ring corresponding to the proximity of the gate and the margin of the p-well surrounding the gate pad area. The polysilicon sheet is insulated from the gate pad by a dielectric layer and is held at the potential of the source by connection with the source metallization. The gate oxide area may extend only partially under the polysilicon sheet seperating the gate pad and the n-type substrate (or n-type epitaxial layer), while the remainder of the polysilicon sheet covers a region of field oxide.

5 Claims, 2 Drawing Sheets

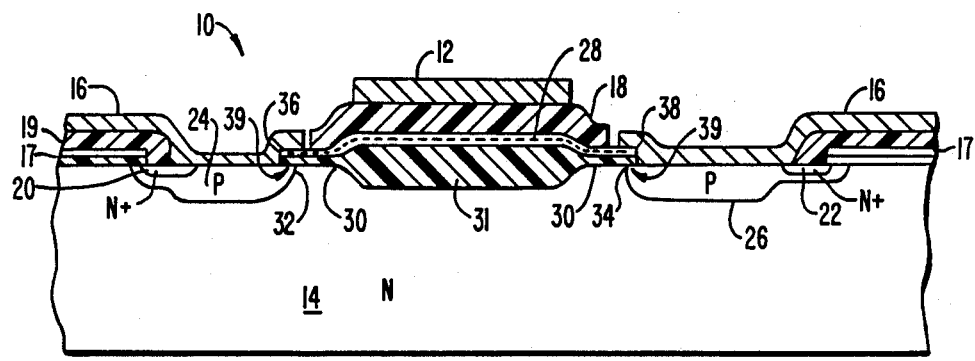
FIG.__1.
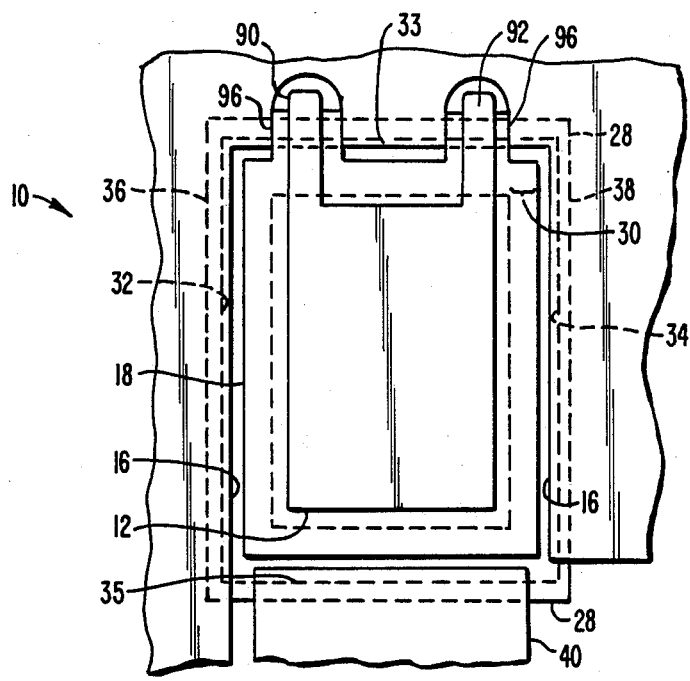
FIG.__2.

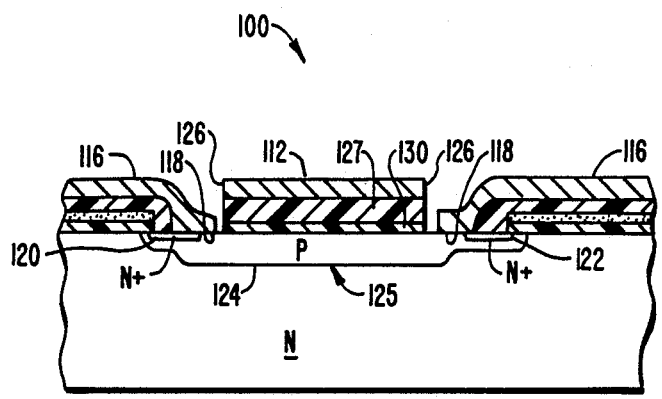
FIG.\_3.   (PRIOR ART)
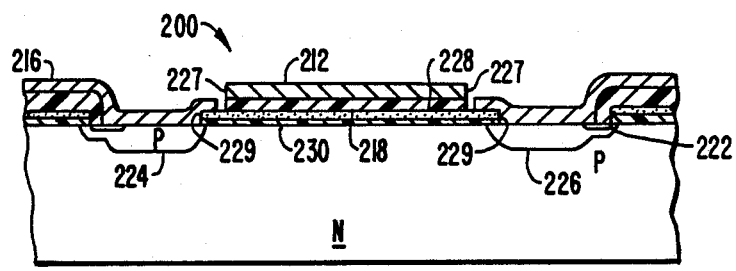
FIG.\_4.
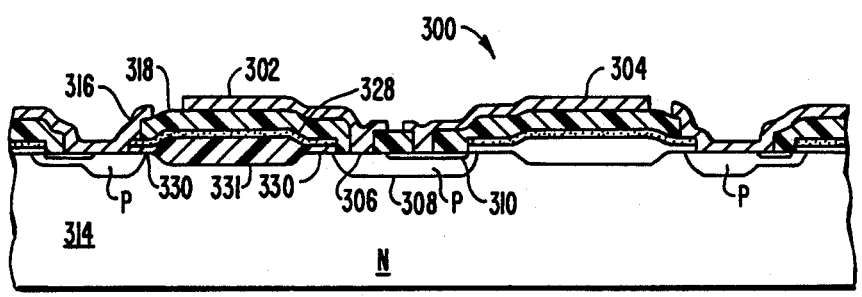
FIG.\_5.

DV/DT OF POWER MOSFETS

BACKGROUND OF THE INVENTION

The present invention relates to power MOSFETs and more particularly to semiconductor structures for improving the rated maximum rate in change of voltage (dv/dt) which can be applied across a power MOSFET. The invention relates specifically to improvement in the structure in the gate pad area of a power MOSFET.

Under conditions where a MOSFET is conducting current in a reverse direction, a significant amount of charge is accumulated and stored in the p-n diode formed beneath the gate bond pad. This stored charge has now been identified as a principal limitation in the maximum rate of change of voltage which can be applied across a MOSFET. This limitation is evident during reverse recovery when the charge is dissipated.

In a typical n-channel power MOSFET, the source bond pad is in contact with almost all of the p-diffusion area, so that all of the p-well is effectively clamped to the potential of the source. However, in the region of the gate pad, there is typically an aluminum layer directly over the p-well in contact with the gate, so the source metallization is constrained to contact the p-well only around the edge of the gate pad. Therefore, under reverse recovery conditions, a high density of current can impinge the edge contacts of the source metallization around the gate p-well, resulting in catastrophic failure of the device.

What is needed is a MOSFET device which minimizes the risk of catastrophic failure due to high current density at the edge contacts of the p-well under the gate pad.

The devices described hereinafter are n-channel MOSFETs. It is to be understood by those of ordinary skill in this art that the invention applies equally well to p-channel MOSFETs by substituting the appropriate semiconductor types.

SUMMARY OF THE INVENTION

According to the invention, a power MOSFET, such as an n-channel MOSFET, is structured to increase the permissible maximum rate of change in voltage during reverse recovery by reducing or eliminating the well containing the active region under the gate bond pad. In an n-channel MOSFET, the well is a p-well and the active region is the p-region within the well. According to the invention, the p-region under the gate bond pad is reduced to a strip or ring corresponding to the proximity of the gate and the margin of the p-well, hereinafter referred to as the p-ring, surrounding the gate pad area. More specifically, the p-well is eliminated under the gate pad area, except around the margins, and a polysilicon sheet is provided under the gate pad (typically an aluminum pad). The polysilicon sheet is insulated from the gate pad by a dielectric layer and is held at the potential of the source by connection with the source metallization. In a specific embodiment, the gate oxide area extends only partially under the polysilicon sheet separating the gate pad and the n-type substrate (or n-type epitaxial layer), while the remainder of the polysilicon sheet covers a region of field oxide. The p-well material bounding the polysilicon sheet forms the p-ring or strip. If there is a portion of the gate pad which is not adjacent the source metallization, aluminum straps may be placed over contact openings to the polysilicon and the p-ring.

The invention will be better understood by referring to the following detailed description in connection with the accompanying drawings.

BRIEF DESCRIPTION OF THE DRAWINGS

FIG. 1 is a side cross-sectional view of a power MOSFET in accordance with a first embodiment of the invention.

FIG. 2 is a top plan view of illustrating a cell of a MOSFET in accordance with one embodiment of the invention.

FIG. 3 is a side cross-sectional view of a portion of a power MOSFET of the prior art.

FIG. 4 is a side cross-sectional view of a power MOSFET in accordance with a second embodiment of the invention.

FIG. 5 is a side cross-sectional view of a power MOSFET in accordance with a fourth embodiment of the invention showing the invention incorporated in a temperature sensing diode.

DETAILED DESCRIPTION OF SPECIFIC EMBODIMENTS

Referring now to FIG. 1 and FIG. 2 together, there is shown a side cross-sectional view of an n-channel power MOSFET lo illustrating the region under the gate pad 12 in accordance with a first embodiment of the invention. The MOSFET is constructed on a substrate 14. In the specific embodiment, the MOSFET 10 is an n-channel device. However, a p-channel device could also be constructed in accordance with the same principles disclosed herein.

Source metallization 16, insulated from the gate 17 by a dielectric 19 is provided at the periphery of the gate pad 12, and the gate pad 12 is insulated from the source metallization 16 and the substrate 14 by a dielectric layer 18. The dielectric layer may be a chemical vapor deposition dielectric.

For each MOSFET cell, there is an n-type source 20, 22 provided within a p-well 24, 26 in the volume of semiconductor material or substrate 14. The source metallization 16 contacts the sources 20, 22 to form a grid of parallel-coupled MOSFET cells which together constitute a power MOSFET with substantial current-carrying capacity.

According to the invention, the p-well 24, 26 does not extend beneath the aluminum gate pad 12 and instead it terminates at margins 32, 34. Moreover, a polysilicon sheet 28 is provided which extends beneath the gate pad 12 and which is electrically coupled to the source metallization 16 at margins 36, 38 of the polysilicon sheet 28. The region of the p-well 24, 26 closest to the polysilicon sheet 28, particularly where the polysilicon sheet 28 overlaps the p-well 24, 26 is a p-ring or strip 39 in accordance with the invention.

In the specific embodiment of FIG. 1 and FIG. 2, a margin of gate oxide 30 of about 1000 Angstroms to 1500 Angstroms thickness is provided between the polysilicon sheet 28 and the substrate 14 around the periphery of the gate pad 12, and field oxide 31 of about an order of magnitude greater thickness (10,000 Angstroms to 15,000 Angstroms) is provided under the remainder of the polysilicon sheet 28. Extensions 90 and 92 of gate pad 12 may contact polysilicon gate region 17. Fingers 96 of dielectric layer 18 underlay a portion of extensions 90 and 92 for insulation. If an area of the gate pad 12 is not adjacent any source metallization, straps 40 may be placed over the contact openings and coupled to the polysilicon sheet 28 (FIG. 2). Thus, the perimeter of the polysilicon sheet 28 forms the p-ring or strip 39 adjacent the margins 32, 33, 34 and 35 of the p-well 24, 26.

FIG. 3 illustrates a conventional or prior art design of a MOSFET 100 for comparison. The p-diffusion or p-region 124 extends under the whole of the gate pad 112. Source metallization 116 terminates on each side of the gate pad 112. The gate is constructed of polysilicon deposited over gate oxide 130 between the source areas 120, 122. The sources 120, 122 ar coupled to the source metallization 116. Under conditions where the MOSFET 100 is conducting current in the reverse direction, a significant amount of charge is stored in the p-n diode 125 beneath the gate bond pad 112. Since the source metallization 116 can contact the p-well 124 only around the edges 126 of the gate pad 112, under reverse recovery conditions, a high density of current can crowd into the edge contacts 118 of the p-well 124, which can result in catastrophic failure of the MOSFET 100. This is a fundamental limitation on the dv/dt characteristic of the device.

FIG. 4 illustrates a second alternative embodiment of a MOSFET 200 in accordance with the invention. As in the embodiment of FIG. 1, the p-well regions 224, 226 terminate near the margins of the pad area 212, and more particularly, near the margins 229 of the polysilicon sheet 228. However, according to the invention, the gate oxide 230 extends beneath all of the polysilicon sheet 228 and thus under all of the pad area 212. This structure has the advantage of more uniform electric field orientation as compared with the embodiment of FIG. 1, which may be beneficial under certain circumstances. However, this structure also results in somewhat elevated source-drain capacitance as compared to the embodiment of FIG. 1.

Referring to FIG. 5, there is illustrated an application of the invention wherein a different type of bond pad is isolated from the source. Therein a MOSFET 300 incorporates a temperature sense diode comprising a temperature sense anode pad 302, a temperature sense cathode pad 304, anode 306 in a p-well 308 and an n-type temperature sense cathode 310. A polysilicon sheet 328 is disposed between the temperature sense anode pad 302, from which it is insulated by a dielectric 318, and the n substrate 314. A gate oxide region 330 and a field oxide region 331 underlie the polysilicon sheet 328, as in the embodiment of FIG. 1. The polysilicon sheet 328 is in electrical contact with the source metallization 316 and isolated from the temperature sense anode pad 302. The p-well areas 324, 326 does not extend under the pad 302. The invention allows the polysilicon sheet 328 to shield the bond pads from the silicon substrate while providing a structure allowing for only minimal capacitive current due to stored charge.

While the system has been described in order to illustrate the preferred embodiments, variations and modifications to the herein described system within the scope of the invention, would undoubtedly suggest themselves to those skilled in the art. Accordingly, the foregoing description should be taken merely as illustrative and the invention should be limited only in accordance with the accompanying claims.

I claim:

1. A power MOSFET structure comprising:
   a volume of semiconductor material doped to a first conductivity type; and
   at least one MOSFET cell;
      said MOSFET cell being formed in said semiconductor material, said MOSFET cell comprising:
      a well region of semiconductor material doped to a second conductivity type opposite to said first conductivity type and having a source region and a gate region, said source region being formed of said first conductivity type,
      a source metallization layer in electrical contact with substantially all of said source region,
      a gate metallization layer,
      a gate pad area under said gate metallization layer confronting said gate region, and
      a polysilicon material layer juxtaposed between said gate metallization layer and said gate region and forming only a strip perimeter region in said gate pad area, said polysilicon material layer separating said pad area from said volume, said polysilicon material layer being in electrical contact with said source metallization layer and electrically insulated from said gate metallization layer in order to tie the potential of said strip perimeter region to the potential of said source metallization layer.

2. The MOSFET structure according to claim 1 wherein said polysilicon material layer in said gate pad area is disposed over a gate oxide region and a field oxide region, said gate oxide region substantially surrounding said field oxide region.

3. The MOSFET structure according to claim 1 wherein said polysilicon material layer in said gate pad area is disposed over a gate oxide region, said gate oxide region extending beneath substantially all of said polysilicon material layer and said gate pad area.

4. The MOSFET structure according to claim 1 wherein said well region extends only to peripheral margins of said polysilicon material layer under said gate pad area.

5. The MOSFET structure according to claim 1 wherein said first conductivity type is n-type semiconductor material and wherein said MOSFET is an n-channel type MOSFET.

* * * * *